(12) United States Patent
Tischler

(10) Patent No.: US 9,231,178 B2
(45) Date of Patent: Jan. 5, 2016

(54) WAFER-LEVEL FLIP CHIP DEVICE PACKAGES AND RELATED METHODS

(71) Applicant: Michael A. Tischler, Scottsdale, AZ (US)

(72) Inventor: Michael A. Tischler, Scottsdale, AZ (US)

(73) Assignee: Cooledge Lighting, Inc., Richmond (CA)

( * ) Notice: Subject to any disclaimer, the term of this patent is extended or adjusted under 35 U.S.C. 154(b) by 53 days.

(21) Appl. No.: 13/784,419

(22) Filed: Mar. 4, 2013

(65) Prior Publication Data

US 2013/0328172 A1 Dec. 12, 2013

Related U.S. Application Data

(60) Provisional application No. 61/656,552, filed on Jun. 7, 2012.

(51) Int. Cl.
*H01L 23/34* (2006.01)
*H01L 33/62* (2010.01)
(Continued)

(52) U.S. Cl.
CPC ............... *H01L 33/62* (2013.01); *H01L 21/78* (2013.01); *H01L 24/27* (2013.01); *H01L 24/29* (2013.01); *H01L 24/83* (2013.01); *H01L 33/50* (2013.01); *H01L 21/6836* (2013.01); *H01L 23/544* (2013.01); *H01L 24/05* (2013.01); *H01L 24/06* (2013.01); *H01L 24/81* (2013.01); *H01L 33/0095* (2013.01); *H01L 2221/68327* (2013.01); *H01L 2221/68336* (2013.01); *H01L 2223/54426* (2013.01); *H01L 2224/0401* (2013.01); *H01L 2224/04026* (2013.01); *H01L 2224/0568* (2013.01); *H01L 2224/05624* (2013.01); *H01L 2224/05638* (2013.01); *H01L 2224/05639* (2013.01); *H01L 2224/05644* (2013.01); *H01L 2224/05655* (2013.01); *H01L 2224/05666* (2013.01); *H01L 2224/05671* (2013.01);
(Continued)

(58) Field of Classification Search
CPC ............... H01L 2924/12041; H01L 25/0657; H01L 2225/06513; H01L 2224/94
USPC .................................. 257/724, 778
See application file for complete search history.

(56) References Cited

U.S. PATENT DOCUMENTS 4,675,575 A 6/1987 Smith et al.
5,081,520 A 1/1992 Yoshii et al.
(Continued)

FOREIGN PATENT DOCUMENTS

CN 102959708 A 3/2013
EP 0265077 4/1988
(Continued)

OTHER PUBLICATIONS

International Search Report and Written Opinion mailed Jun. 2, 2011 for International Application No. PCT/CA2011/050006 (7 pages).
(Continued)

*Primary Examiner* — Howard Weiss
*Assistant Examiner* — Tifney Skyles
(74) *Attorney, Agent, or Firm* — Morgan, Lewis & Bockius LLP

(57) ABSTRACT

In accordance with certain embodiments, semiconductor dies are at least partially coated with a conductive adhesive prior to singulation and subsequently bonded to a substrate having electrical traces thereon.

27 Claims, 6 Drawing Sheets

(51) Int. Cl.
*H01L 21/78* (2006.01)
*H01L 33/50* (2010.01)
*H01L 23/00* (2006.01)
H01L 23/544 (2006.01)
H01L 21/683 (2006.01)
H01L 33/00 (2010.01)

(52) U.S. Cl.
CPC .......... *H01L2224/05686* (2013.01); *H01L 2224/06102* (2013.01); *H01L 2224/13144* (2013.01); *H01L 2224/13147* (2013.01); *H01L 2224/27003* (2013.01); *H01L 2224/27436* (2013.01); *H01L 2224/2929* (2013.01); *H01L 2224/29298* (2013.01); *H01L 2224/32227* (2013.01); *H01L 2224/73104* (2013.01); *H01L 2224/80001* (2013.01); *H01L 2224/83191* (2013.01); *H01L 2224/83203* (2013.01); *H01L 2224/83385* (2013.01); *H01L 2224/83851* (2013.01); *H01L 2224/94* (2013.01); *H01L 2225/06513* (2013.01); *H01L 2924/07811* (2013.01); *H01L 2924/12041* (2013.01); *H01L 2924/15787* (2013.01); *H01L 2933/0066* (2013.01)

(56) References Cited

U.S. PATENT DOCUMENTS

| | | |
|---|---|---|
| 5,631,191 A | 5/1997 | Durand et al. |
| 5,918,113 A | 6/1999 | Higashi et al. |
| 6,281,450 B1 | 8/2001 | Urasaki et al. |
| 6,306,686 B1 | 10/2001 | Horton et al. |
| 6,357,889 B1 | 3/2002 | Duggal et al. |
| 6,357,893 B1 | 3/2002 | Belliveau |
| 6,478,909 B1 | 11/2002 | Tuttle |
| 6,501,102 B2 | 12/2002 | Mueller-mach et al. |
| 6,513,949 B1 | 2/2003 | Marshall et al. |
| 6,518,097 B1 * | 2/2003 | Yim et al. ............... 438/119 |
| 6,576,488 B2 | 6/2003 | Collins, III et al. |
| 6,603,258 B1 | 8/2003 | Mueller-mach et al. |
| 6,614,103 B1 | 9/2003 | Durocher et al. |
| 6,621,211 B1 | 9/2003 | Srivastava et al. |
| 6,642,652 B2 | 11/2003 | Collins, III et al. |
| 6,650,044 B1 | 11/2003 | Lowery |
| 6,665,170 B1 | 12/2003 | Warner et al. |
| 6,685,852 B2 | 2/2004 | Setlur et al. |
| 6,689,999 B2 | 2/2004 | Haines et al. |
| 6,733,711 B2 | 5/2004 | Durocher et al. |
| 6,764,878 B2 | 7/2004 | Fujisawa et al. |
| 6,936,857 B2 | 8/2005 | Doxsee et al. |
| 6,939,481 B2 | 9/2005 | Srivastava et al. |
| 6,965,361 B1 | 11/2005 | Sheats et al. |
| 6,998,777 B2 | 2/2006 | Suehiro et al. |
| 7,005,679 B2 | 2/2006 | Tarsa et al. |
| 7,025,651 B2 | 4/2006 | Song et al. |
| 7,042,165 B2 | 5/2006 | Madhani et al. |
| 7,052,924 B2 | 5/2006 | Daniels et al. |
| 7,115,983 B2 | 10/2006 | Wagner |
| 7,122,405 B2 | 10/2006 | Tiao |
| 7,163,327 B2 | 1/2007 | Henson et al. |
| 7,206,507 B2 | 4/2007 | Lee et al. |
| 7,207,693 B2 | 4/2007 | Ratcliffe |
| 7,217,956 B2 | 5/2007 | Daniels et al. |
| 7,244,326 B2 | 7/2007 | Craig et al. |
| 7,256,483 B2 | 8/2007 | Epler et al. |
| 7,259,030 B2 | 8/2007 | Daniels et al. |
| 7,294,861 B2 | 11/2007 | Schardt et al. |
| 7,294,961 B2 | 11/2007 | Daniels et al. |
| 7,316,488 B2 | 1/2008 | Wall, Jr. |
| 7,319,246 B2 | 1/2008 | Soules et al. |
| 7,335,951 B2 | 2/2008 | Nishi et al. |
| 7,344,902 B2 | 3/2008 | Basin et al. |
| 7,344,952 B2 | 3/2008 | Chandra |
| 7,427,782 B2 | 9/2008 | Daniels et al. |
| 7,482,760 B2 | 1/2009 | Jungwirth et al. |
| 7,488,088 B2 | 2/2009 | Brukilacchio |
| 7,488,621 B2 | 2/2009 | Epler et al. |
| 7,498,734 B2 | 3/2009 | Suehiro et al. |
| 7,564,070 B2 | 7/2009 | Sayers et al. |
| 7,618,157 B1 | 11/2009 | Galvez et al. |
| 7,638,854 B2 | 12/2009 | Tanaka et al. |
| 7,642,708 B2 | 1/2010 | Juestel et al. |
| 7,656,371 B2 | 2/2010 | Shimizu et al. |
| 7,663,234 B2 | 2/2010 | Sun et al. |
| 7,682,850 B2 | 3/2010 | Harbers et al. |
| 7,703,942 B2 | 4/2010 | Narendran et al. |
| 7,723,733 B2 | 5/2010 | Daniels et al. |
| 7,740,373 B2 | 6/2010 | Yoon et al. |
| 7,758,221 B2 | 7/2010 | Weijers |
| 7,766,536 B2 | 8/2010 | Peifer et al. |
| 7,775,685 B2 | 8/2010 | Loh |
| 7,791,093 B2 | 9/2010 | Basin et al. |
| 7,811,843 B1 | 10/2010 | Lai |
| 7,819,539 B2 | 10/2010 | Kim et al. |
| 7,821,023 B2 | 10/2010 | Yuan et al. |
| 7,828,459 B2 | 11/2010 | Rains |
| 7,833,837 B2 | 11/2010 | Yang et al. |
| 7,838,346 B2 | 11/2010 | Tokunaga |
| 7,847,302 B2 | 12/2010 | Basin et al. |
| 7,855,092 B2 | 12/2010 | Shimizu et al. |
| 7,858,198 B2 | 12/2010 | Kashiwagi et al. |
| 7,858,408 B2 | 12/2010 | Mueller et al. |
| 7,863,760 B2 | 1/2011 | Daniels et al. |
| 7,897,483 B2 | 3/2011 | Yamazaki et al. |
| 7,898,085 B2 | 3/2011 | Fujimori |
| 7,902,550 B2 | 3/2011 | Yamazaki |
| 7,902,560 B2 | 3/2011 | Bierhuizen et al. |
| 7,909,480 B2 * | 3/2011 | Kang et al. ............... 362/249.02 |
| 7,909,496 B2 | 3/2011 | Matheson et al. |
| 7,932,531 B2 | 4/2011 | Lin et al. |
| 7,948,468 B2 | 5/2011 | Zane et al. |
| 7,972,031 B2 | 7/2011 | Ray et al. |
| 7,997,784 B2 | 8/2011 | Tsai |
| 1,024,317 A1 | 10/2011 | Mooney et al. |
| 8,119,427 B1 | 2/2012 | Lu |
| 8,338,849 B2 | 12/2012 | Tischler et al. |
| 8,384,114 B2 | 2/2013 | Tischler et al. |
| 8,384,121 B2 | 2/2013 | Tischler et al. |
| 8,466,488 B2 | 6/2013 | Tischler et al. |
| 8,493,000 B2 | 7/2013 | Jungwirth |
| 8,552,463 B2 | 10/2013 | Tischler et al. |
| 8,653,539 B2 | 2/2014 | Tischler et al. |
| 8,680,567 B2 | 3/2014 | Tischler et al. |
| 8,704,448 B2 | 4/2014 | Tischler et al. |
| 8,860,318 B2 | 10/2014 | Tischler et al. |
| 8,877,561 B2 | 11/2014 | Tischler |
| 8,907,370 B2 | 12/2014 | Tischler et al. |
| 8,921,134 B2 | 12/2014 | Tischler et al. |
| 2002/0179816 A1 | 12/2002 | Haines et al. |
| 2003/0019735 A1 | 1/2003 | Howie et al. |
| 2003/0102570 A1 | 6/2003 | Imasu et al. |
| 2005/0056948 A1 | 3/2005 | Uchiyama |
| 2005/0073840 A1 | 4/2005 | Chou et al. |
| 2005/0110161 A1 | 5/2005 | Naito et al. |
| 2005/0183884 A1 | 8/2005 | Su |
| 2005/0214963 A1 | 9/2005 | Daniels et al. |
| 2005/0230853 A1 | 10/2005 | Yoshikawa |
| 2006/0001055 A1 | 1/2006 | Ueno et al. |
| 2006/0186423 A1 | 8/2006 | Blonder et al. |
| 2006/0228973 A1 | 10/2006 | Janning |
| 2007/0069663 A1 | 3/2007 | Burdalski et al. |
| 2007/0096113 A1 | 5/2007 | Inoshita et al. |
| 2007/0096272 A1 | 5/2007 | Wang |
| 2007/0145884 A1 | 6/2007 | Wu et al. |
| 2007/0211449 A1 | 9/2007 | Holman et al. |
| 2007/0223219 A1 | 9/2007 | Medendorp, Jr. et al. |
| 2007/0252512 A1 | 11/2007 | Bertram et al. |
| 2007/0262920 A1 | 11/2007 | Werner et al. |
| 2007/0297020 A1 | 12/2007 | Shen et al. |
| 2008/0007885 A1 | 1/2008 | Mehrl et al. |
| 2008/0019134 A1 | 1/2008 | Mukai |
| 2008/0101070 A1 | 5/2008 | Chou |
| 2008/0157689 A1 | 7/2008 | Kato |

(56) References Cited

U.S. PATENT DOCUMENTS

| | | |
|---|---|---|
| 2008/0179602 A1 | 7/2008 | Negley et al. |
| 2008/0179611 A1 | 7/2008 | Chitnis et al. |
| 2008/0186704 A1 | 8/2008 | Chou et al. |
| 2008/0239724 A1 | 10/2008 | Moriyama et al. |
| 2008/0315228 A1 * | 12/2008 | Krames et al. .................. 257/98 |
| 2009/0002810 A1 | 1/2009 | Jeon et al. |
| 2009/0026915 A1 | 1/2009 | Nagatomi et al. |
| 2009/0073350 A1 | 3/2009 | Toyama et al. |
| 2009/0095966 A1 | 4/2009 | Keller et al. |
| 2009/0096370 A1 | 4/2009 | Murazaki et al. |
| 2009/0108474 A1 | 4/2009 | Mizutani |
| 2009/0109668 A1 | 4/2009 | Isobe |
| 2009/0114932 A1 | 5/2009 | Chou |
| 2009/0160364 A1 | 6/2009 | Ackermann et al. |
| 2009/0166064 A1 | 7/2009 | Nishikawa et al. |
| 2009/0178834 A1 | 7/2009 | Akutsu et al. |
| 2009/0212257 A1 | 8/2009 | Sohn et al. |
| 2009/0239086 A1 | 9/2009 | Ishizuka et al. |
| 2009/0243457 A1 | 10/2009 | Jung et al. |
| 2009/0244882 A1 | 10/2009 | Samber et al. |
| 2009/0256163 A1 | 10/2009 | Chakraborty |
| 2010/0001631 A1 | 1/2010 | Gotoh et al. |
| 2010/0051984 A1 | 3/2010 | West |
| 2010/0060144 A1 | 3/2010 | Justel et al. |
| 2010/0075459 A1 | 3/2010 | Kerr et al. |
| 2010/0085727 A1 | 4/2010 | Igarashi et al. |
| 2010/0096977 A1 | 4/2010 | Lee et al. |
| 2010/0207536 A1 | 8/2010 | Burdalski et al. |
| 2010/0214777 A1 | 8/2010 | Suehiro et al. |
| 2010/0244071 A1 | 9/2010 | Wada et al. |
| 2010/0277084 A1 | 11/2010 | Lee et al. |
| 2010/0283072 A1 | 11/2010 | Kazlas et al. |
| 2010/0295070 A1 | 11/2010 | Su et al. |
| 2010/0295077 A1 | 11/2010 | Melman |
| 2010/0295078 A1 | 11/2010 | Chen et al. |
| 2010/0320928 A1 | 12/2010 | Kaihotsu et al. |
| 2011/0002140 A1 | 1/2011 | Tsukahara et al. |
| 2011/0031516 A1 | 2/2011 | Basin et al. |
| 2011/0045619 A1 | 2/2011 | Ling |
| 2011/0058372 A1 | 3/2011 | Lerman et al. |
| 2011/0063838 A1 | 3/2011 | Dau et al. |
| 2011/0101399 A1 | 5/2011 | Suehiro et al. |
| 2011/0104834 A1 | 5/2011 | Suehiro et al. |
| 2011/0108878 A1 | 5/2011 | Namiki et al. |
| 2011/0114989 A1 | 5/2011 | Suehiro et al. |
| 2011/0163681 A1 | 7/2011 | Dau et al. |
| 2011/0163683 A1 | 7/2011 | Steele et al. |
| 2011/0180818 A1 | 7/2011 | Lerman et al. |
| 2011/0193105 A1 | 8/2011 | Lerman et al. |
| 2011/0193106 A1 | 8/2011 | Lerman et al. |
| 2011/0193114 A1 | 8/2011 | Lerman et al. |
| 2011/0195532 A1 | 8/2011 | Lerman et al. |
| 2011/0198631 A1 | 8/2011 | Lerman et al. |
| 2011/0198632 A1 | 8/2011 | Lerman et al. |
| 2011/0204390 A1 | 8/2011 | Lerman et al. |
| 2011/0204391 A1 | 8/2011 | Lerman et al. |
| 2011/0303936 A1 | 12/2011 | Wu |
| 2011/0316422 A1 | 12/2011 | Tischler et al. |
| 2012/0146066 A1 | 6/2012 | Tischler et al. |
| 2012/0217496 A1 | 8/2012 | Tischler et al. |
| 2012/0248477 A1 | 10/2012 | Tischler et al. |
| 2013/0181619 A1 | 7/2013 | Tischler et al. |
| 2013/0301274 A1 | 11/2013 | Anderson |
| 2013/0330853 A1 | 12/2013 | Tischler |
| 2014/0034960 A1 | 2/2014 | Tischler et al. |
| 2014/0062302 A1 | 3/2014 | Tischler et al. |
| 2014/0062315 A1 | 3/2014 | Tischler et al. |
| 2014/0191257 A1 | 7/2014 | Tischler et al. |
| 2015/0001465 A1 | 1/2015 | Tischler et al. |
| 2015/0042231 A1 | 2/2015 | Tischler et al. |

FOREIGN PATENT DOCUMENTS

| | | |
|---|---|---|
| EP | 1067598 | 1/2001 |
| EP | 1473978 | 11/2004 |
| EP | 1653523 | 5/2006 |
| EP | 1770788 | 4/2007 |
| EP | 2017890 | 1/2009 |
| EP | 2031437 | 3/2009 |
| EP | 2589082 A1 | 5/2013 |
| EP | 2609791 A1 | 7/2013 |
| JP | 55-8061 A | 1/1980 |
| JP | 9-148374 A | 6/1997 |
| JP | 2001-7157 A | 1/2001 |
| JP | 2001-298042 A | 10/2001 |
| JP | 2002-76057 A | 3/2002 |
| JP | 2005-136399 A | 5/2005 |
| JP | 2007-123613 A | 5/2007 |
| JP | 2007-142173 A | 6/2007 |
| JP | 2010-135513 A | 6/2010 |
| JP | 2011-251645 A | 12/2011 |
| JP | 2013-531378 A | 8/2013 |
| JP | 2014-160835 A | 9/2014 |
| KR | 10-1372084 B1 | 3/2014 |
| TW | 423166 | 9/1999 |
| WO | WO-90/01751 | 2/1990 |
| WO | WO-99/60829 | 11/1999 |
| WO | WO-2005/062382 | 7/2005 |
| WO | WO-2005/119314 | 12/2005 |
| WO | WO-2007/067758 | 6/2007 |
| WO | 2007/094167 A1 | 8/2007 |
| WO | WO-2007/105853 | 9/2007 |
| WO | WO-2008/051397 | 5/2008 |
| WO | WO-2009/079040 | 6/2009 |
| WO | WO-2010/098273 | 9/2010 |
| WO | 2012/000114 A1 | 1/2012 |

OTHER PUBLICATIONS

International Search Report and Written Opinion mailed Sep. 7, 2011 for International Application No. PCT/CA2011/050399 (11 pages).

Internatioanl Search Report and Written Opinion mailed Oct. 24, 2011 for International Application No. PCT/CA2011/050436 (9 pages).

Internatioanl Search Report and Written Opinion mailed Aug. 30, 2010 for International Application No. PCT/US2010/039684 (9 pages).

Examination Report Received for Korean Patent Application No. 10-2013-7002293, mailed on Aug. 29, 2013, 10 pages (4 pages of English Translation and 6 pages of Official Copy).

Extended European Search Report received for European Patent Application No. 11800038, mailed on Jan. 26, 2015, 11 pages.

Examination Report Received for Japanese Patent Application No. 2013-516931, mailed on Aug. 16, 2013, 7 pages (4 pages of English Translation and 3 pages of Official Copy).

Examination Report Received for Japanese Patent Application No. 2014-063919, mailed on Dec. 17, 2014, 7 pages (4 pages of English Translation and 3 pages of Official Copy).

Extended European Search Report received for European Patent Application No. 11819246.7, mailed on Jul. 8, 2014, 6 pages Examination Report Received for Japanese Patent Application No. 2013-516931, mailed on Nov. 20, 2013, 17 pages(15 pages of English Translation and 2 pages of Official Copy).

PCT International Patent Application No. PCT/CA2011/050399, International Preliminary Report on Patentability mailed Jan. 17, 2013, 9 pages PCT International Patent Application No. PCT/CA2011/050436, International Preliminary Report on Patentability mailed Mar. 7, 2013, 7 pages PCT International Patent Application No. PCT/US2010/039684, International Preliminary Report on Patentability issued Jan. 4, 2012, 8 pages Park et al., "Printed Assemblies of Inorganic Light-Emitting Diodes for Deformable and Semitransparent Displays", Science, vol. 325. No. 5943, Aug. 21, 2009, pp. 977-981.

* cited by examiner

WAFER-LEVEL FLIP CHIP DEVICE PACKAGES AND RELATED METHODS

RELATED APPLICATION

This application claims the benefit of and priority to U.S. Provisional Patent Application No. 61/656,552, filed Jun. 7, 2012, the entire disclosure of which is hereby incorporated herein by reference.

FIELD OF THE INVENTION

In various embodiments, the present invention relates to the fabrication of a wafer-level flip chip package by use of a conductive adhesive.

BACKGROUND

A wide range of electronics packaging technologies have been developed for semiconductor devices to meet the varied needs of different applications. Over time semiconductor dimensions have decreased and pin counts have increased. Additionally, there is a growing need to support a wider range of operating currents at both high and low current levels. Packaging technology has had difficulty meeting these needs.

The package has a large impact on performance, size, price and reliability of the product. The flip-chip technique has been developed in response to a range of these needs. In the flip chip approach, the chips are fabricated with contacts on the top surface and then flipped over for attachment of those contacts to conductive traces on a substrate (e.g., a circuit board) or in a package. This approach has the advantage of eliminating wire bonding, but has a number of challenges in terms of process complexity and cost because it requires a complicated solder-based connection process, including solder bump formation, chip to board alignment, reflow, flux removal, underfill, and cure processes. Moreover, flip-chip processes are generally performed on individual singulated devices, and thus uniformity and repeatability are often problematic.

In view of the foregoing, there is a need for a more uniform and less complex flip-chip-based packaging process for electronic devices batch processed on semiconductor substrates.

SUMMARY

Embodiments of the present invention provide techniques for fabricating a large-scale or wafer-level flip-chip package, which is advantageous in terms of production cost by simplifying the processes associated with the flip-chip die attachment process. Embodiments of the present invention simplify the processes necessary for connection of chips to a final substrate by, e.g., elimination of conventional solder bump flip-chip processes such as solder bump formation, chip to board alignment, reflow, flux removal, underfill and cure processes. Particularly, various embodiments obviate the need for solder or non-solder bumps, such as gold stud bumps and/or electroless Ni/Au bumps.

In accordance with embodiments of the present invention, anisotropic conductive adhesive (ACA), whether in a form of a film, paste, gel, or a solution, is applied over the wafer before dicing of the wafer into individual chips each containing one or more electronic devices such as light-emitting diodes (LEDs). After being positioned on the substrate or package, the diced chips (or "dies") that are coated with the ACA are bonded to, e.g., heat-pressed against, a substrate so that the individual chips are electrically connected via the conductive particles of the ACA and physically bonded via the polymeric resin of the ACA to conductive traces on the substrate without the use of solder or stud bumps. In one embodiment of the present invention, a yielding, i.e., flexible and/or deformable, substrate is used, which facilitates the connection between contacts on a chip and conductive traces formed over the yielding substrate without the use of solder or non-solder bumps, as detailed in U.S. patent application Ser. No. 13/171,973, filed on Jun. 29, 2011, the entire disclosure of which is incorporated by reference herein. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of LEEs include solid-state, organic, polymer, phosphor-coated or high-flux LEDs, microLEDs (described below), laser diodes or other similar devices as would be readily understood. The emitted radiation of a LEE may be visible, such as red, blue or green, or invisible, such as infrared or ultraviolet. A LEE may produce radiation of a spread of wavelengths. A LEE may feature a phosphorescent or fluorescent material for converting a portion of its emissions from one set of wavelengths to another. A LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

A LEE may be of any size. In some embodiments, a LEEs has one lateral dimension less than 500 µm, while in other embodiments a LEE has one lateral dimension greater than 500 um. Exemplary sizes of a relatively small LEE may include about 175 µm by about 250 µm, about 250 µm by about 400 µm, about 250 µm by about 300 µm, or about 225 µm by about 175 µm. Exemplary sizes of a relatively large LEE may include about 1000 µm by about 1000 µm, about 500 µm by about 500 µm, about 250 µm by about 600 µm, or about 1500 µm by about 1500 µm. In some embodiments, a LEE includes or consists essentially of a small LED die, also referred to as a "microLED." A microLED generally has one lateral dimension less than about 300 µm. In some embodiments, the LEE has one lateral dimension less than about 200 µm or even less than about 100 µm. For example, a microLED may have a size of about 225 µm by about 175 µm or about 150 µm by about 100 µm or about 150 µm by about 50 µm. In some embodiments, the surface area of the top surface of a microLED is less than 50,000 µm$^2$ or less than 10,000 µm$^2$. The size of the LEE is not a limitation of the present invention, and in other embodiments the LEE may be relatively larger, e.g., the LEE may have one lateral dimension on the order of at least about 1000 µm or at least about 3000 µm.

As used herein, "phosphor" refers to any material that shifts the wavelengths of light irradiating it and/or that is fluorescent and/or phosphorescent. As used herein, a "phosphor" may refer to only the powder or particles (of one or more different types) or to the powder or particles with the binder, and in some circumstances may refer to region(s) containing only the binder (for example, in a remote-phosphor configuration in which the phosphor is spaced away from the LEE). The terms "wavelength-conversion material" and "light-conversion material" are utilized interchangeably with "phosphor" herein. The light-conversion material is incorporated to shift one or more wavelengths of at least a portion of the light emitted by LEEs to other (i.e., different) desired wavelengths (which are then emitted from the larger device alone or color-mixed with another portion of the original light emitted by the LEE). A light-conversion material may include or consist essentially of phosphor powders, quantum dots, organic dyes, or the like within a transparent binder. Phosphors are typically available in the form of powders or particles, and in such case may be mixed in binders. An exemplary binder is silicone, i.e., polyorganosiloxane, which is most commonly polydimethylsiloxane (PDMS). Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The specific components and/or formulation of the phosphor and/or matrix material are not limitations of the present invention.

The binder may also be referred to as an encapsulant or a matrix material. In one embodiment, the binder includes or consists essentially of a transparent material, for example silicone-based materials or epoxy, having an index of refraction greater than 1.35. In one embodiment the binder and/or phosphor includes or consists essentially of other materials, for example fumed silica or alumina, to achieve other properties, for example to scatter light, or to reduce settling of the powder in the binder. An example of the binder material includes materials from the ASP series of silicone phenyls manufactured by Shin Etsu, or the Sylgard series manufactured by Dow Corning.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

Herein, a contact being "available for electrical connection" means the contact has sufficient free area to permit attachment to, e.g., a conductive trace, a circuit board, etc., and "free" means lacking any electrical connection (and in preferred embodiments, any mechanical connection) thereto.

In an aspect, embodiments of the invention feature a method of fabricating an electronic device. An anisotropic conductive adhesive (ACA) is applied onto a surface of a wafer that includes or consists essentially of a plurality of unsingulated chips. Each chip includes a plurality of electrical contacts each having a top surface substantially coplanar with or recessed below a surface of the chip surrounding the electrical contact. Thereafter, the wafer is singulated into individual chips, each of which includes first and second electrical contacts with the ACA thereover. A substrate is provided. The substrate has first and second conductive traces on a first surface thereof in a bonding region, and the first and second conductive traces are separated by a gap therebetween. The first and second electrical contacts of one of the chips are positioned over the first and second conductive traces, a portion of the ACA being disposed between the electrical contacts and the traces. The first and second electrical contacts of the chip are bonded to the first and second traces, respectively, thereby establishing electrical connection between (i) the first electrical contact and the first trace and/or (ii) the second electrical contact and the second trace, but without electrically bridging the traces together or electrically bridging the electrical contacts together.

Embodiments of the invention may feature one or more of the following in any of a variety of different combinations. The substrate may be a yielding substrate. The bonding may include or consist essentially of applying pressure to the substrate and/or the chip. Applying pressure to the substrate and/or the chip may include or consist essentially of compressing the substrate and the chip between a substantially rigid surface and a substantially compliant surface to adhere the first and second electrical contacts to the first and second traces. The first and second electrical contacts may be non-coplanar. Applying pressure to the substrate and/or the chip may include or consist essentially of compressing the substrate and the chip between a substantially rigid surface and a substantially compliant surface to adhere the first and second electrical contacts to the first and second traces notwithstanding the non-coplanarity between the first and second electrical contacts. The bonding may include or consist essentially of applying heat to the substrate and/or the chip. The bonding may include or consist essentially of applying heat and pressure to the substrate and/or the chip. The bonding may include or consist essentially of applying a magnetic field and heat to the substrate and/or the chip. The substrate may be flexible but not deformable, deformable but not flexible, or deformable and flexible. Providing the substrate may include printing the first and second traces thereon. Providing the substrate may include forming the first and second traces thereon by evaporation, physical vapor deposition, chemical vapor deposition, sputtering, lamination, and/or plating. The ACA may include or consist essentially of an anisotropic conductive film. Applying the ACA over the wafer may include or consist essentially of laminating the anisotropic conductive film to the wafer.

Singulating the wafer may include or consist essentially of cutting, sawing, dicing, laser cutting, water jet cutting, and/or die cutting. The positioned chip may include or consist essentially of a light-emitting diode (LED) die, e.g., an inorganic LED die. At least a portion of the LED die may include or consist essentially of a semiconductor material comprising or consisting essentially of silicon, GaAs, InAs, AlAs, InP, GaP, AlP, InSb, GaSb, AlSb, GaN, InN, AN, SiC, ZnO, and/or an alloy or mixture thereof. The positioned chip may include or consist essentially of a laser. Providing the substrate and bonding the electrical contacts to the traces may be performed in a roll-to-roll process. The first and second electrical contacts may be substantially coplanar and, at least in the bonding region, the height of the first and second traces above the first surface of the substrate may not exceed 10 µm. Electrical contacts of at least one additional chip may be bonded to additional traces on the substrate substantially simultaneously with the bonding of the electrical contacts to the traces. A phosphor material may be formed over at least a portion of the chip, the phosphor material converting at least a portion of light emitted by the chip to light of a different wavelength. The ACA may be at least partially transparent. For each unsingulated chip, the top surface of each of the plurality of electrical contacts may be absolutely coplanar with or recessed below the surface of the chip surrounding the electrical contact. For each unsingulated chip, the top surface of each of the plurality of electrical contacts may be recessed below the surface of the chip surrounding the electrical contact by more than 3 μm, e.g., by more than 5 μm, or even by more than 10 μm. For each unsingulated chip, each of the plurality of electrical contacts may be in direct physical contact with (i) a semiconductor portion of the wafer thereunder and (ii) the ACA.

In another aspect, embodiments of the invention feature a method of fabricating an electronic device. A wafer including or consisting essentially of a plurality of semiconductor layers is provided. A plurality of electrical contacts are formed on a surface of the wafer, thereby defining a plurality of unsingulated chips each including a plurality of the electrical contacts. Each electrical contact is in direct contact with at least one of the semiconductor layers thereunder. Thereafter, and without formation of a metallic or conductive layer (e.g., one or more stud bumps) on the electrical contacts therebetween, an anisotropic conductive adhesive (ACA) is applied onto the surface of the wafer and in direct contact with each of the electrical contacts. Thereafter, the wafer is singulated into individual chips, each chip including first and second electrical contacts with the ACA thereover. A substrate is provided. The substrate has first and second conductive traces on a first surface thereof in a bonding region, the first and second conductive traces being separated by a gap therebetween. First and second electrical contacts of one of the chips are positioned over the first and second conductive traces, a portion of the ACA being disposed between the electrical contacts and the traces. The first and second electrical contacts of the chip are bonded to the first and second traces, respectively, thereby establishing electrical connection between (i) the first electrical contact and the first trace and/or (ii) the second electrical contact and the second trace, but without electrically bridging the traces together or electrically bridging the electrical contacts together.

Embodiments of the invention may feature one or more of the following in any of a variety of different combinations. The ACA may include or consist essentially of an anisotropic conductive film. Applying the ACA onto the surface of the wafer may include or consist essentially of laminating the anisotropic conductive film to the wafer. For each unsingulated chip, the top surface of each of the plurality of electrical contacts may be absolutely coplanar with or recessed below the surface of the chip surrounding the electrical contact. For each unsingulated chip, the top surface of each of the plurality of electrical contacts may be recessed below the surface of the chip surrounding the electrical contact by more than 3 μm, e.g., by more than 5 μm, or even by more than 10 μm. Forming the plurality of electrical contacts over the surface of the wafer may include or consist essentially of only a single deposition step.

In yet another aspect, embodiments of the invention feature a composite wafer including or consisting essentially of (a) a semiconductor substrate including or consisting essentially of a plurality of at least partially unsingulated chips, each chip including (i) a plurality of exposed electrical contacts and (ii) a non-contact region disposed between the electrical contacts, a top surface each of the electrical contacts being substantially coplanar with or recessed below a surface of the non-contact region disposed around the electrical contact, and (b) an anisotropic conductive adhesive (ACA) on the semiconductor substrate, including the electrical contacts and the non-contact region of each chip.

Embodiments of the invention may feature one or more of the following in any of a variety of different combinations. A plurality of trenches may extend through only a portion of a thickness of the substrate, partially singulating the chips. A portion of the ACA may be disposed over each of the trenches. The ACA may include or consist essentially of discrete portions separated approximately along the trenches. The ACA may include or consist essentially of an anisotropic conductive film. Each chip may include or consist essentially of a light-emitting diode (LED) die, e.g., an inorganic LED die. At least a portion of each LED die may include or consist essentially of a semiconductor material including or consisting essentially of silicon, GaAs, InAs, AlAs, InP, GaP, AlP, InSb, GaSb, AlSb, GaN, InN, AN, SiC, ZnO, and/or an alloy or mixture thereof. Each chip may include or consist essentially of a laser. The thickness of the ACA across the semiconductor substrate may be substantially uniform. For each at least partially unsingulated chip, the top surface of each of the plurality of electrical contacts may be absolutely coplanar with or recessed below the surface of the chip surrounding the electrical contact. For each at least partially unsingulated chip, the top surface of each of the plurality of electrical contacts may be recessed below the surface of the chip surrounding the electrical contact by more than 3 μm, by more than 5 μm, or even by more than 10 μm. For each at least partially unsingulated chip, each of the plurality of electrical contacts may be in direct physical contact with (i) a semiconductor portion of the wafer thereunder and (ii) the ACA.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The term "light" broadly connotes any wavelength or wavelength band in the electromagnetic spectrum, including, without limitation, visible light, ultraviolet radiation, and infrared radiation. Similarly, photometric terms such as "illuminance," "luminous flux," and "luminous intensity" extend to and include their radiometric equivalents, such as "irradiance," "radiant flux," and "radiant intensity." As used herein, the terms "substantially," "approximately," and "about" mean±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Semiconductor fabrication and packaging is often divided into front-end and back-end semiconductor processes. Typically front-end processes are carried out in the clean room in batch processes, including, e.g., various cleaning, patterning, deposition, doping and material-removal processes, while back-end processing is focused on packaging and testing. The entire process typically has a very large number of complex and expensive steps (sometimes several hundred). The front-end process may include the formation of one or more epitaxial layers on a substrate, followed by a series of deposition, patterning, and processing steps. Some deposition processes may be performed over the entire substrate (or "wafer"), while others are performed selectively on only portions of the substrate. Materials to be deposited may include dielectrics, such as oxide or nitrides, or metals such as Cr, Al, Au, Ti, and the like. Patterning may also be accompanied by removal of a portion of one or more of the epitaxial layers, substrate, dielectric, and/or metal. Dopants may be introduced to modify the electrical properties of the semiconductor during epitaxial growth or subsequently using operations such as diffusion or ion implantation. Successive cycles of deposition, patterning, and removal (not necessarily in that order or combination) are used to fabricate the completed wafer (i.e., the collection of chips that will eventually be singulated into discrete devices).

Figure 1A:
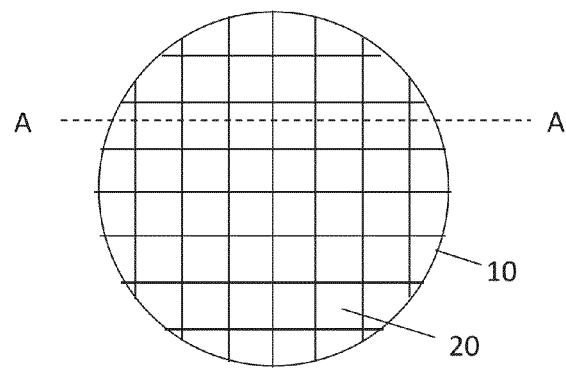
FIG. 1A is a plan-view schematic of a semiconductor wafer composed of unsingulated chips.
Figure 1B:
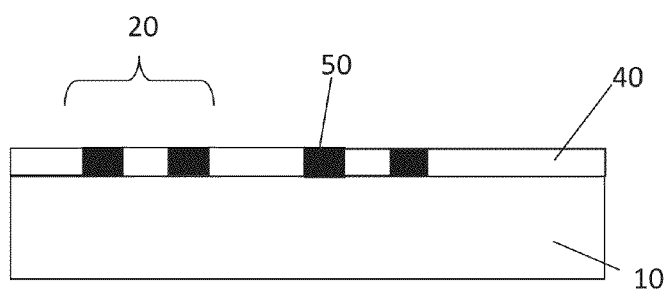
FIG. 1B is a schematic cross-sectional view taken along a portion of the line A-A of FIG. 1A.

Referring to FIG. 1A, a wafer 10 is produced by a semiconductor fabrication process and includes or consists essentially of multiple chips 20, each of which may include or consist essentially of an LEE. As shown in FIG. 1B, which shows a cross-section along a portion of line A-A in FIG. 1A, each chip 20 includes at least one contact pad 50 for conduction of signals to and from the chip 20. In between contact pads 50 is an optional passivation layer 40 that is typically electrically insulating (and which may include or consist essentially of, in various embodiments, an insulator such as silicon nitride and/or silicon oxide).

Figure 1C:
FIGS. 1C-1H are schematic cross-sectional views illustrating a process of fabricating at least a portion of the structure shown in FIG. 1B in accordance with various embodiments of the invention.
Figure 1D:
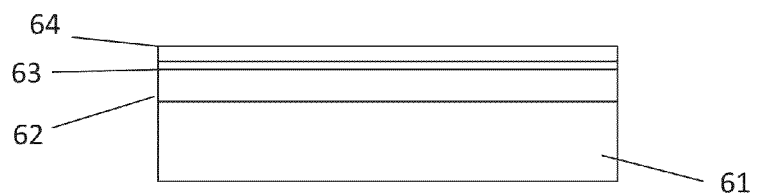
Figure 1E:
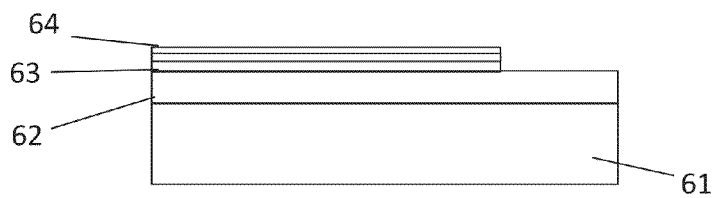
Figure 1F:
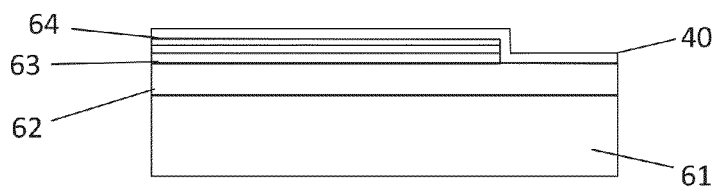
Figure 1G:
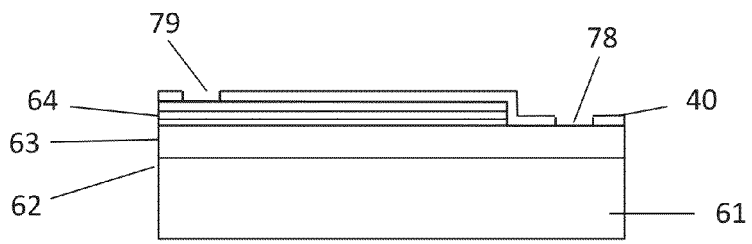
Figure 1H:
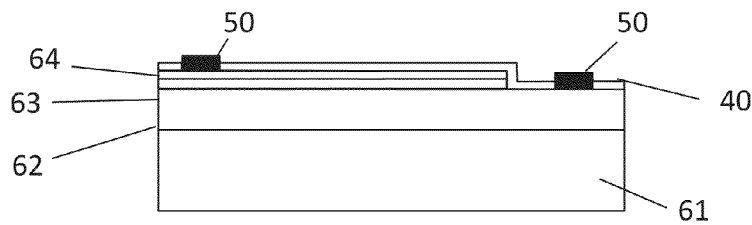

FIGS. 1C-1H depict one example of a process utilized in embodiments of the present invention, where each chip 20 is an LEE such as an LED. These figures show a portion of wafer 10 from FIG. 1A. The process starts with a wafer portion 61 (i.e., a portion of wafer 10, also referred to generally as a "substrate" for the device(s) formed thereover), as shown in FIG. 1C. (As shown in FIG. 1A, typically the processes utilized to form chips 20 are performed on the entire wafer 10 and thus define the multiple chips 20 simultaneously; parts of the processes will be described herein in reference to single devices or chips 20 for clarity.) Over substrate 61 are formed epitaxial layers 62, 63 and 64, as shown in FIG. 1D. In some embodiments, layer 62 is doped n-type and layer 64 is doped p-type, and layer 60 is a light-emitting or "active" layer from which light is emitted upon application of voltage to contacts electrically connected to layers 62 and 64. FIG. 1E shows the structure of FIG. 1D at a later stage of manufacture. In FIG. 1E portions of layers 63 and 64 (and optionally layer 62) are removed, exposing a portion of layer 62. FIG. 1F shows the structure of FIG. 1E at a later stage of manufacture. In FIG. 1F the optional passivation layer 40 is formed over the structure of FIG. 1E. FIG. 1G shows the structure of FIG. 1F at a later stage of manufacture. In FIG. 1G, the passivation layer 40 is patterned to form openings 78 and 79 that expose portions of layers 62 and 64 respectively. FIG. 1H shows the structure of FIG. 1G at a later stage of manufacture. In FIG. 1H, the contact pads 50 are formed in openings 78 and 79 by, e.g., deposition of a metal material over at least openings 78 and 79 and removal of the metal from the passivation layer 40 if necessary. Each contact pad 50 may be formed from one or more metals. While the process shown in FIGS. 1C-1H is an exemplary process for LEEs such as LEDs, this is not a limitation of the present invention, and in other embodiments any other type of circuit, device, or chip may be utilized or fabricated.

In some embodiments of the present invention, contact pads 50 may each include or consist essentially of more than one layer and/or more than one type of contact metallurgy. For example, in some embodiments, contact pads 50 may include an adhesion-promoting layer, a contact-formation layer (to provide a low contact resistance to the underlying semiconductor), and a protective or connection layer that provides a stable, robust surface for external connection. Contact pads 50 may be formed by a variety of different techniques, for example evaporation, sputtering, plating, chemical vapor deposition, physical vapor deposition, or the like. The method by which contact pads 50 are formed is not a limitation of the present invention. In some embodiments, contact pads 50 are formed using more than one process. In some embodiments, contact pads 50 may include or consist essentially of one or more metals, for example Al, Cr, Ti, Au, Ni, Ag, Mo, or the like. In some embodiments, contact pads 50 may include or consist essentially of a metal silicide or metal nitride compound. In some embodiments, an annealing or alloying step is carried out after deposition of the material of contact pad 50. Such an annealing or alloying step may be used to further improve the contact resistance or the contact stability. The composition, structure, or method of manufacture of contact pads 50 is not a limitation of the present invention.

Figure 2A:
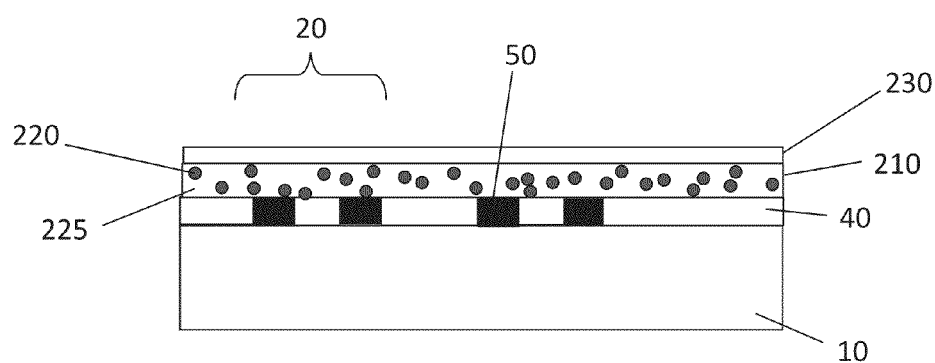
FIG. 2A depicts the view of FIG. 1B after application of an anisotropic conductive adhesive over the wafer in accordance with various embodiments of the invention.

FIG. 2A shows the structure of FIG. 1B or 1H at a later stage of manufacture. With reference to FIG. 2A, an ACA layer 210 is applied over the wafer 10 directly on the structure of FIG. 1H, without, e.g., formation of additional metal or conductive layers, e.g., stud bumps, over the contact pads 50. Application of the ACA layer 210 may be followed by the optional formation of a protective layer 230 over ACA layer 210. In many conventional processes, stud bumps are typically utilized to facilitate electrical contact to a contact pad, as the contact pad lacks sufficient extent (if any) above surrounding portions of the chip to enable reliable electrical contact thereto. Typically, stud bumps are made of gold or copper (e.g., one or more metals other than that of the contact pads) and extend above the surrounding surface of the chip by tens of microns. However, embodiments of the present invention enable electrical contact to contact pads without the use of stud bumps, saving the expense of related material and fabrication processes, reducing fabrication time and increasing yield, and thus, as shown in FIG. 2A, ACA 210 is in direct contact with contact pads 50.

Figure 2B:
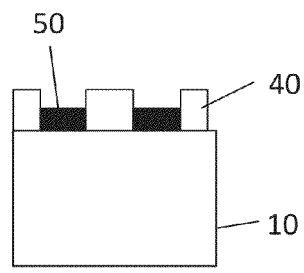
FIGS. 2B and 2C are schematic cross-sectional views of portions of unsingulated chips having different contact geometries in accordance with various embodiments of the invention.
Figure 2C:
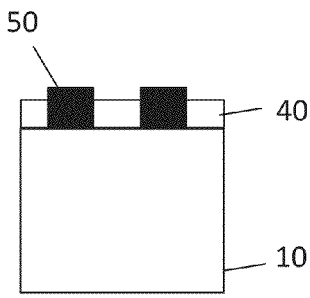

As shown in FIG. 1B, the contact pads 50 and passivation layer 40 collectively define the top "surface" of the chip 20. In one embodiment of the present invention, the top surface of contact pad 50 is coplanar or substantially coplanar with the top surface of passivation layer 40 as shown in FIG. 1B. (As utilized herein, "substantially coplanar" means coplanar with or extending above or below the surrounding surface by no more than 3 μm, in contrast with "absolutely coplanar," which means that there is no visibly detectable difference in the levels of the surface of the contact pad and the surrounding surface.) In other embodiments of the present invention, the top surface of contact pad 50 is below the surface of passivation layer 40 (as shown in FIG. 2B) while in other embodiments, the top surface of contact pad 50 extends above the surface of passivation layer 40 (as shown in FIG. 2C). In some embodiments, passivation layer 40 is not present and in these cases the reference point (i.e., the "surface" of chip 20) is the material or surface adjacent to contact pad 50.

In various embodiments of the present invention, the top surface of a contact pad 50 extends above the top surface of passivation layer 40 by less than 3 μm, or even less than 1 μm. In one embodiment, the top surface of contact pad 50 is recessed below the top surface of passivation layer 40, as shown in FIG. 1B. In one embodiment, the top surface of contact pad 50 is at least 0.5 μman below the top surface of passivation layer 40. In one embodiment, the top surface of contact pad 50 is at least 1 μman below the top surface of passivation layer 40. In one embodiment, the top surface of contact pad 50 is at least 2 μm, or even at least 3 μm below the top surface of passivation layer 40. In one embodiment, the top surface of contact pad 50 is at least 5 μm, or even at least 10 μman below the top surface of passivation layer 40. Herein an contact pad is defined as a contact directly in contact with an underlying semiconductor layer that at least partially defines a chip 20, wherein the top surface of the contact pad is less than 3 μman above the adjacent surface, for example the surface of a passivation layer.

ACA 210 may include an epoxy or adhesive matrix 225 and a plurality of conductive particles 220 within the matrix 225. Conductive particles 220 may include or consist essentially of, for example, Au, Ni, or Ni— and Au— covered polymer particles, or Au, Ni, or Ni— and Au— covered polymer particles that are coated with an insulating layer. The specific configuration and materials of the ACA (which may also be in the form of a film, i.e., an anisotropic conductive film (ACF)) are not a limitation of the present invention. The application of ACA 210 to wafer 10 may be achieved by dispensing, casting, spraying, use of a doctor blade, or a meniscus process using an ACA solution. Alternatively, an ACF may be employed, in which case the film may be adhered or laminated on wafer 10. The thickness of the ACF may be in the range of about 5 μm to about 50 μm or larger. In one embodiment, the ACA or ACF is then heated and pressed against or laminated to the wafer to attach ACA or ACF 210 to wafer 10. In some embodiments a release film is applied over ACF or ACA 210 or over optional protective layer 230 prior to heating and pressing or lamination, in order to prevent adhesion of ACA or ACF 210 or optional protective layer 230 to the heating, pressing, or lamination apparatus. While subsequent references to adhesive 210 will be referred to as ACA 210 herein for convenience, it should be understood that ACA 210 may include or consist essentially of an ACF unless otherwise indicated. Preferably ACA 210 is attached to wafer 10 without the formation of voids between wafer 10 and/or contact pads 50 and ACA 210. In some embodiments, the heating and application of pressure is performed in a partial vacuum. In one embodiment, the ACA 210 is partially cured on the wafer during this process. In some embodiments, the ACA 210 resin is in a semi-cured state at this point in the process, for example about 50% cured. In various embodiments of the present invention, the ACA 210 is at least partially "pressure-activated," i.e., conductive paths vertically through the ACA 210 are formed via the application of pressure to the ACA 210.

Figure 3:
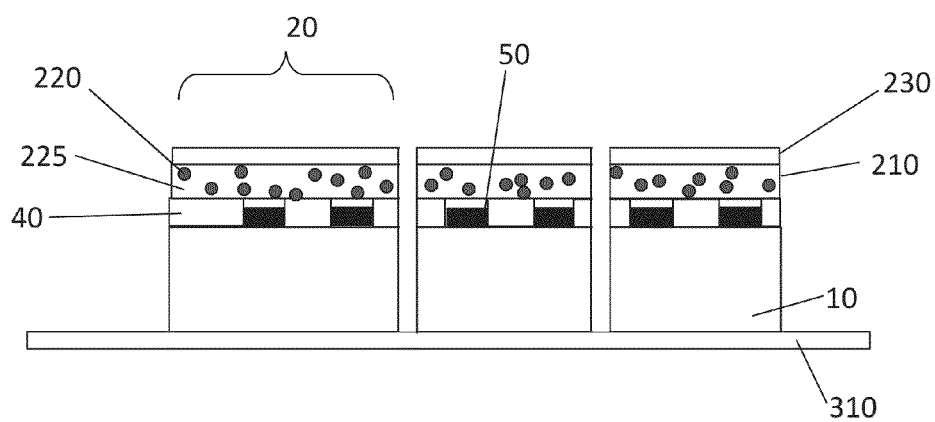
FIG. 3 depicts the view of FIG. 2A after attachment of the wafer to a temporary substrate and singulation of the individual chips in accordance with various embodiments of the invention.

After formation of ACA 210 to wafer 10, wafer 10 and ACA 210 are singulated. Singulation may be performed by any of a variety of techniques, for example scribing, sawing, dicing, laser cutting, water jet cutting, or the like. In some embodiments, wafer 10 is mounted on a temporary substrate 310 for the singulation process, as shown in FIG. 3. The method of singulation is not a limitation of the present invention. The singulation process results in separation of wafer 10 into individual dies 20, where each die 20 includes a portion of ACA 210, as shown in FIG. 3. Singulation is performed between dies 20; thus, in some embodiments, the singulation tool is aligned with the spaces or trenches (i.e., cuts or other depressions, also known as "streets") between dies 20. In some embodiments, the ACA 210 is transparent or partially transparent so that the positions of the singulation cuts are between dies 20. FIG. 3 shows one die 20 per singulation unit; however, this is not a limitation of the present invention, and in other embodiments one or more singulation units include multiple dies 20. In other embodiments, ACA 210 is opaque or translucent and alignment of the singulation tool with the streets may be accomplished by other techniques, for example using alignment marks, fiducials, etc. The method of alignment of the singulation tool to the streets on wafer 10 is not a limitation of the present invention. Another aspect of this process is the adhesion of ACA 210 to wafer 10. ACA 210 generally has sufficient adhesion to wafer 10 such that singulation does not cause delamination or partial delamination of ACA 210 from wafer 10. In some embodiments, the dies 20 are partially singulated prior to ACA 210 being applied, and thus the ACA 210 overlies the trenches that are disposed between and that partially define the dies 20.

In some embodiments, the spacing between dies 20 after singulation is determined by the kerf of the singulation process. In some embodiments, it may be advantageous to increase the spacing between dies 20 for a subsequent step in the process, for example a pick-and-place operation to attach the dies 20 to a substrate. In some embodiments, the spacing is increased by use of a temporary substrate 310 that is expandable, for example an expandable dicing tape, e.g., Tape 18733 from Semiconductor Equipment Corporation, and using a die expander tool, e.g., a model 1810 die matrix expander manufactured by Semiconductor Equipment Corporation. The expandable tape may be stretched, for example using a die matrix expander tool, to increase the space between dies 20.

Figure 4:
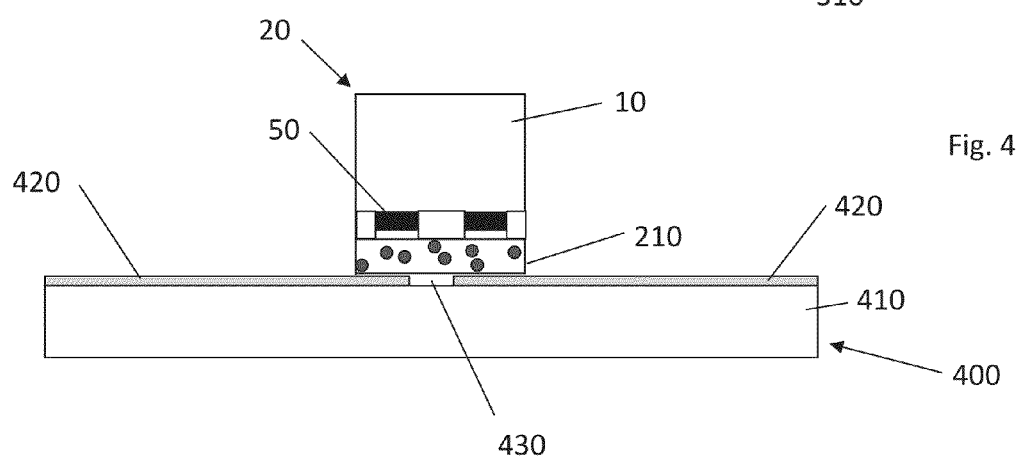
FIG. 4 is a schematic cross-section of an individual chip with anisotropic conductive adhesive aligned over conductive traces of a substrate in accordance with various embodiments of the invention.

After singulation and optional expansion, dies 20 are attached to a substrate featuring one or more conductive elements, such that the one or more contacts 50 are electrically coupled to one or more conductive elements on the substrate. FIG. 4 shows bonded structure 400 featuring substrate 410 over which conductive elements 420 are formed and a die 20 positioned over substrate 410 in a flip-chip mounting configuration where contacts 50 are positioned over conductive traces 420. Conductive traces 420 are configured with a gap 430 between adjacent conductive traces 420 and die 20 is positioned over gap 430 such that all or a portion of a first contact 50 is over a portion of a first conductive element 420 and all or a portion of second contact 50 is positioned over a second conductive element 420. Contacts 50 are separated from conductive traces 420 by ACA 210. In FIG. 4, optional protective layer 230 has been removed or was absent.

In some embodiments, ACA 210 is activated or cured, for example by using heat, pressure, radiation (e.g., visible or UV light), magnetic field, or a combination of two or more of these activation methods, to create a conductive path between contacts 50 and conductive elements 420. In one embodiment, ACA 210 is activated using a combination of heat and pressure. After positioning as shown in FIG. 4, pressure and heat are applied to activate ACA 210, resulting in the structure shown in FIG. 5. Positioning of dies 20 on substrate 410 may be performed by any technique; a common method of positioning is to utilize a pick-and-place tool that removes dies 20 from tape 310 and places them over conductive elements 420 over substrate 410. In some embodiments, the temperature for curing is in the range of about 70° C. to about 250° C., the pressure is in the range of about 4 gram to about 800 gram force for a 20,000 $\mu m^2$ contact pad, and the curing time is in the range of about 10 seconds to about 30 minutes. In other embodiments, the bonding pressure (or force) is measured in Newtons, and an appropriate bonding force is in the range of about 0.01 to about 2.0 N for an area of about 5000 $\mu m^2$. The force, temperature and time ranges used are dependent on the specific type of ACA 210 and are not a limitation of the present invention. In some embodiments, pressure is applied by compressing the substrate and individual dies between two substantially rigid surfaces. In some embodiments, pressure is applied by compressing the substrate and individual dies between a substantially rigid surface and a substantially compliant surface.

Figure 5:
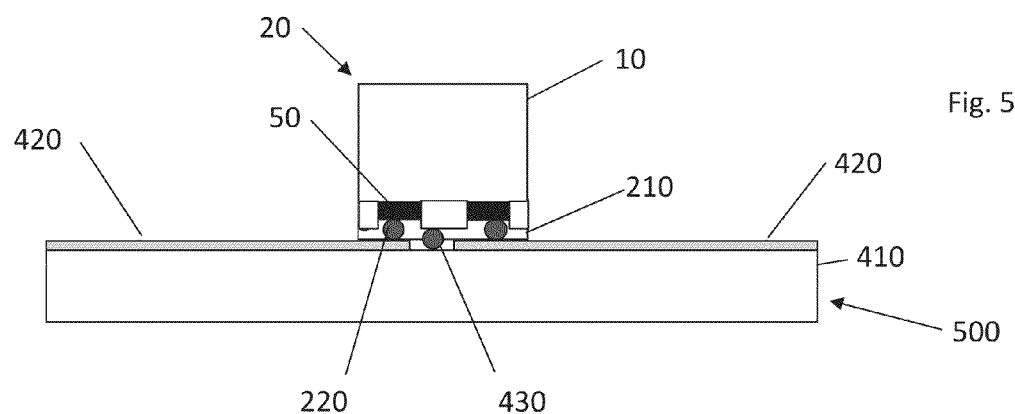
FIG. 5 depicts the chip of FIG. 4 after activation of the anisotropic conductive adhesive to bond the chip to the substrate in accordance with various embodiments of the invention.

FIG. 5 shows a magnified view of the bonding region, showing an example of bonded structure 400 after curing or activation of ACA 210, herein referred to as bonded structure 500. As shown in FIG. 5, ACA 210 is compressed such that one or more conductive particles 220 forms a conductive path between one contact 50 and one conductive element 420. There is no electrical coupling between adjacent conductive elements 420 because the conductive particles 220 do not form an electrically continuous bridge between the two adjacent conductive traces. While FIG. 5 shows one conductive particle 220 forming the conductive path between a contact 50 and a conductive element 420, this is not a limitation of the present invention, and in other embodiments more than one conductive particle 220 may form the conductive path between contact 50 and conductive element 420.

Figure 6A:
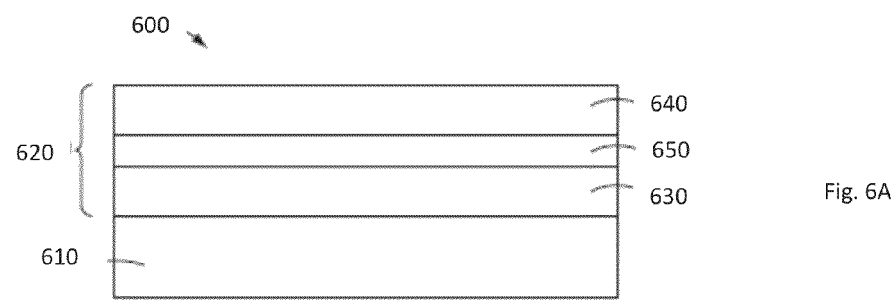
FIGS. 6A and 6B are schematic cross-sections of semiconductor dies in accordance with various embodiments of the invention.
Figure 6B:
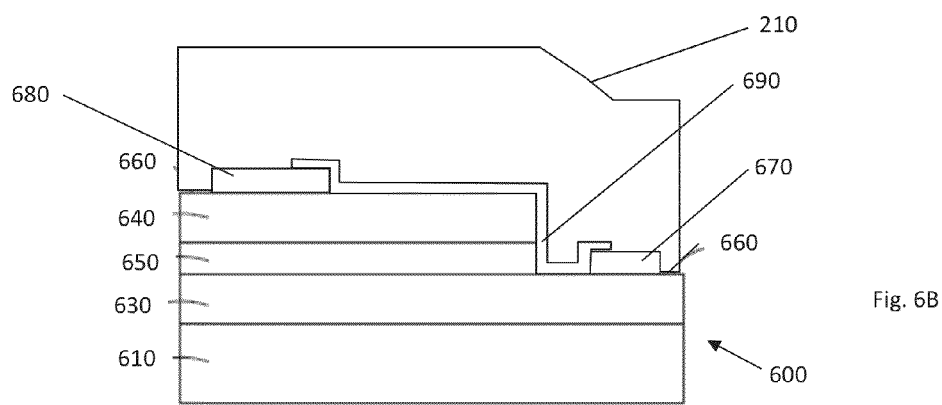

In one embodiment, die 20 includes or consists essentially of an LEE die, for example an LED or laser. FIGS. 6A and 6B depict an exemplary semiconductor die 600 for use in various embodiments of the present invention. As shown in FIGS. 6A and 6B, semiconductor die 600 is similar to an individual die 20 as shown in FIG. 3, that is, semiconductor dies 600 in FIGS. 6A and 6B are shown after the wafer dicing or singulation process. Semiconductor die 600 typically includes a substrate 610 with one or more semiconductor layers 620 disposed thereover. In this exemplary embodiment, semiconductor die 600 represents an LEE such as an LED or a laser, but other embodiments of the invention feature one or more semiconductor die with different or additional functionality, e.g., processors, sensors, detectors, and the like. Non-LEE die may or may not be bonded as described herein, and may have contact geometries differing from those of the LEEs; moreover, they may or may not have semiconductor layers disposed over a yielding substrate as discussed below.

Substrate 610 may include or consist essentially of one or more semiconductor materials, e.g., silicon, GaAs, InP, GaN, and may be doped or substantially undoped (e.g., not intentionally doped). In some embodiments, substrate 610 includes or consists essentially of gallium nitride, gallium phosphide, gallium arsenide, sapphire or silicon carbide. Substrate 610 may be substantially transparent to a wavelength of light emitted by the semiconductor die 600. As shown for an LEE, semiconductor layers 620 may include first and second doped layers 630, 640, which preferably are doped with opposite polarities (i.e., one n-type doped and the other p-type doped). One or more light-emitting layers 650, e.g., one or more quantum wells, may be disposed between layers 630, 640. Each of layers 630, 640, 650 may include or consist essentially of one or more semiconductor materials, e.g., silicon, InAs, AlAs, GaAs, InP, AlP, GaP, InSb, GaSb, AlSb, GaN, AN, InN, and/or mixtures and alloys (e.g., ternary or quaternary, etc. alloys) thereof. In preferred embodiments, semiconductor die 600 is an inorganic, rather than a polymeric or organic, device. As referred to herein, semiconductor dies may be packaged or unpackaged unless specifically indicated (e.g., a bare-die LED or bare-die LEE is an unpackaged semiconductor die). In some embodiments, substantially all or a portion of substrate 610 is removed prior to or after the bonding of semiconductor die 600 described below. Such removal may be performed by, e.g., chemical etching, laser lift-off, mechanical grinding and/or chemical-mechanical polishing or the like. In some embodiments all or a portion of substrate 610 may be removed and a second substrate—e.g., one that is transparent to or reflective of a wavelength of light emitted by semiconductor die 600—is attached to substrate 610 or semiconductor layers 620 prior to or after the bonding of semiconductor die 600 as described below. In some embodiments, substrate 610 includes or consists essentially of silicon and all or a portion of silicon substrate 610 may be removed prior to or after the bonding of semiconductor die 600 described below. Such removal may be performed by, e.g., chemical etching, laser lift off, mechanical grinding and/or chemical-mechanical polishing or the like.

As shown in FIG. 6B, in preferred embodiments semiconductor die 600 is patterned and etched (e.g., via conventional photolithography and etch processes) such that a portion of layer 630 is exposed in order to facilitate electrical contact to layer 630 and layer 640 on the same side of semiconductor die 600 (and without, for example, the need to make contact to layer 630 through substrate 610 or to make contact to layer 630 with a shunt electrically connecting a contact pad over layer 640 to layer 630). One or more portions of layers 640, 650 are removed (or never formed) in order to expose a portion of layer 630, and in some embodiments, as shown in FIG. 6B, a surface 660 of semiconductor die 600 that is non-planar, i.e., contains exposed portions non-coplanar with each other. Surface 660 corresponds to the outer surface of semiconductor die 600, including any contour or topography resulting from portions of layers not being present. In order to facilitate electrical contact to semiconductor die 600, discrete electrical contacts 670, 680 are formed on layers 630, 640, respectively. Electrical contacts 670, 680 may each include or consist essentially of a suitable conductive material, e.g., one or more metals or metal alloys, conductive oxides, or other suitable conductive materials and may or may not be coplanar. FIG. 6B shows non-coplanar electrical contacts 670, 680, but this is not a limitation of the present invention, and in other embodiments electrical contacts 670, 680 are coplanar. In some embodiments, the vertical offset between exposed surfaces of layer 630 and layer 640 (and/or between non-coplanar contacts 670, 680) is at least 0.25 µm, at least 1 µm, at least 3 µm, or even greater.

In some embodiments, semiconductor die 600 has a square shape, while in other embodiments semiconductor die 600 has a rectangular shape. In some preferred embodiments, to facilitate bonding (as described below) semiconductor die 600 may have a shape with a dimension in one direction that exceeds a dimension in an orthogonal direction (e.g., a rectangular shape), and have an aspect ratio of the orthogonal directions (length to width, in the case of a rectangular shape) of semiconductor die 600 greater than about 1.2:1. In some embodiments, semiconductor die 600 has an aspect ratio greater than about 2:1 or greater than 3:1. The shape and aspect ratio are not critical to the present invention, however, and semiconductor die 600 may have any desired shape. In some embodiments, semiconductor die 600 has one lateral dimension less than 800 µm. Exemplary sizes of semiconductor die 600 may include ~250 µm×~600 µm, ~250 µm×~400 µm, ~200 µm×~300 µm, or ~225 µm×~175 µm. The size of semiconductor die 600 is not a limitation of the present invention and in other embodiments semiconductor die 600 may have any size and/or any shape.

Because electrical contact to contacts 670, 680 is made via use of a an ACA or ACF rather than, e.g., wire bonds, contacts 670, 680 may have a relatively small geometric extent since ACAs or ACFs may be utilized to contact even very small areas impossible to connect with wires or ball bonds (which typically require bond areas of at least 80 µm on a side). In various embodiments, the extent of one or both of contacts 670, 680 in one dimension (e.g., a diameter or side length) is less than approximately 100 µm, less than approximately 70 µm, less than approximately 35 µm, or even less than approximately 20 µm; however, the size of contacts 670, 680 is not a limitation of the present invention, and in other embodiments contacts 670, 680 may have any size and/or any shape.

Figure 6C:
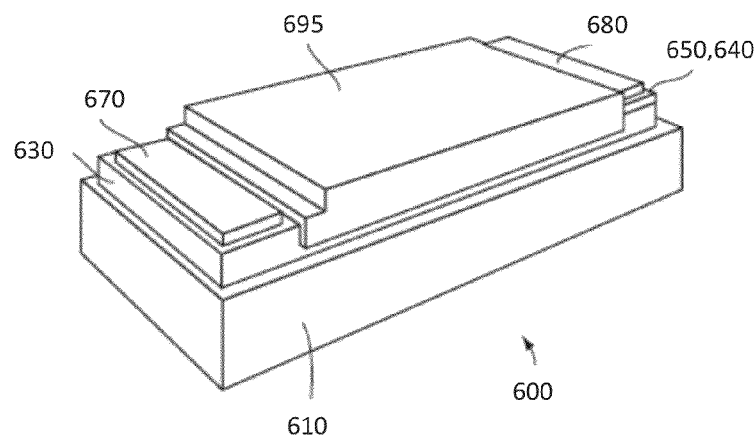
FIG. 6C is a schematic cross-section of a semiconductor die in accordance with various embodiments of the invention.

Particularly if semiconductor die 600 includes or consists essentially of an LEE such as a LED or laser, contacts 670, 680 may be reflective (at least to some or all of the wavelengths emitted by semiconductor die 600) and hence reflect emitted light back toward substrate 610. In some embodiments, a reflective contact 680 covers a portion or substantially all of layer 640, while a reflective contact 670 covers a portion or substantially all of layer 630. In addition to reflective contacts, a reflector 690 (not shown in subsequent figures for clarity) may be disposed between or above portions of contacts 670, 680 and over portions or substantially all of layer 640 and 630. Reflector 690 is reflective to at least some or all wavelengths of light emitted by semiconductor die 600 and may be composed of various materials. In one embodiment, reflector 690 is non-conductive so as not to electrically connect contacts 670, 680. Reflector 690 may be a Bragg reflector. Reflector 690 may include or consist essentially of one or more conductive materials, e.g., metals such as silver, gold, platinum, aluminum, etc. Instead of or in addition to reflector 690, exposed surfaces of semiconductor die 600 except for contacts 670, 680 may be coated with one or more layers of an insulating material, e.g., a nitride such as silicon nitride or an oxide such as silicon dioxide. In some embodiments, contacts 670, 680 include a bond portion for connection to traces 710 (see FIG. 7) and a current-spreading portion for providing more uniform current through semiconductor die 600, and in some embodiments, one or more layers of an insulating material are formed over all or portions of semiconductor die 600 except for the bond portions of contacts 670, 680. FIG. 6C shows a schematic of die 600 with insulating material 695 covering the surface of semiconductor die 600 except for contacts 670, 680. Insulating material 695 may include or consist essentially of, for example, silicon nitride, polyimide, silicon oxide and/or silicon dioxide. Such insulating material 695 may cover all or portions of the top and sides of semiconductor die 600 as well as portions of the top and sides of layers 630, 640 and 650. Insulating material 695 may act to prevent shorting between contacts 670 and 680 or between traces 710 (see FIG. 7), or both during and after the bonding operation with the ACA or ACF.

FIG. 6B shows ACA 210 overlaying and or laminated to semiconductor die 600. As described above, ACA 210 is generally formed over multiple (e.g., a wafer of) semiconductor dies 600 prior to singulation into individual semiconductor dies 600. In some embodiments, ACA 210 is completely or substantially conformal to the surface of semiconductor dies 600, as shown in FIG. 6B. However, this is not a limitation of the present invention, and in other embodiments ACA 210 is not conformal or substantially conformal to the surface of semiconductor dies 600.

With reference to FIGS. 6A, 6B, 6C, and 7, semiconductor die 600 generally operates at a current and temperature sufficiently low to prevent melting or other damage to ACA 210 or to the substrate 700. For example, the operating current of semiconductor die 600 may be less than approximately 250 mA, 100 mA, or in some embodiments less than 50 mA. In some embodiments, the operation current is between approximately 1 mA and approximately 25 mA. In some embodiments, the junction temperature of semiconductor die 600 during operation may not exceed approximately 125° C., 100° C., 90° C., or may not exceed 80° C. It should be understood, however, that this is not critical to the present invention, and in other embodiments the drive current and/or junction temperature may be any value that does not damage or otherwise adversely affect substrate 700, ACA 210 or other components of the system. Substrates such as polyethylene naphthalate (PEN), for example, can generally withstand higher temperatures than polyethylene terephthalate (PET), and those of skill in the art can straightforwardly choose a substrate material appropriate to a particular application.

In some preferred embodiments, the small size of a semiconductor die 600, particularly of an unpackaged semiconductor die 600, and its abovementioned relatively low operating current and temperature, obviate the need for a relatively high thermal conductivity substrate as is conventionally used, for example a ceramic substrate (such as $Al_2O_3$, AlN, or the like) or metal-core printed circuit board (MCPCB) or a discrete or integrated heat sink (i.e., a highly thermally conductive fixture (comprising, for example, metal or ceramic materials) such as a plate or block, which may have projections such as fins to conduct heat away and into the surrounding ambient environment) to be in thermal communication with semiconductor die 600. Rather, substrate 700 itself (as well as, e.g., the ACA, the traces, and even the surrounding ambient environment itself) provides adequate conduction of heat away from semiconductor die 600 during operation.

Figure 7:
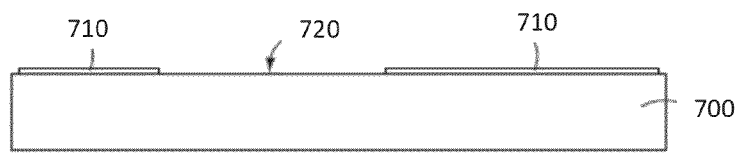
FIG. 7 is a schematic cross-section of a yielding substrate utilized in accordance with various embodiments of the invention.
Figure 8A:
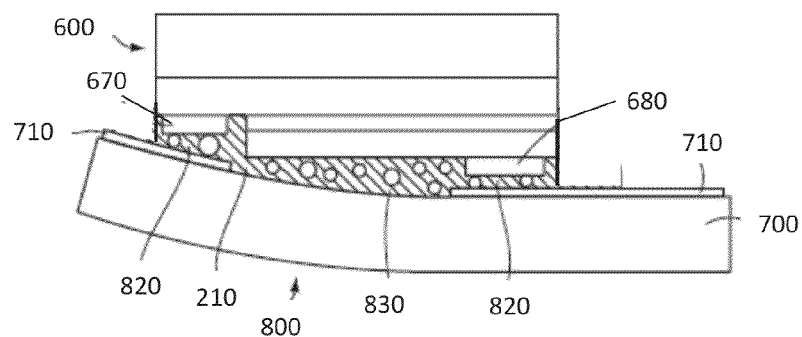
FIGS. 8A and 8B are schematic cross-sections of semiconductor dies adhered to yielding substrates in accordance with various embodiments of the invention.
Figure 8B:
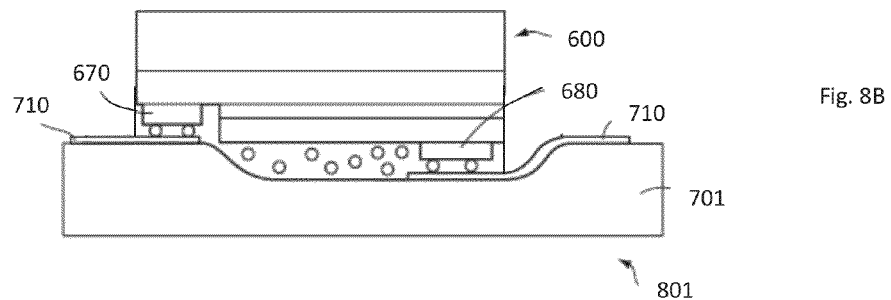

FIG. 7 depicts an exemplary substrate 700 for use in various embodiments of the present invention. In some embodiments, substrate 700 is preferably yielding, i.e., flexible and/or deformable, and may be flexible or rigid to permit electrical coupling between contacts on the semiconductor die and traces on the substrate using an ACA or ACF—even in embodiments where the contacts on the semiconductor die are non-planar —without damaging the semiconductor die. This may be achieved, for example, by the substrate flexing as shown in FIG. 8A or deforming as shown in FIG. 8B. Such deformation may be elastic (returning to the original shape after the load is removed) or plastic (maintaining permanent deformation after the load is removed) or a combination of elastic and plastic deformation. In various embodiments, the substrate may both flex and deform. In some embodiments, substrate 700 is flexible and has a radius of curvature of about 1 m or less, or about 0.5 m or less, or even about 0.1 m or less. In some embodiments, substrate 700 has a Young's Modulus less than about 100 N/m$^2$, less than about 50 N/m$^2$, or even less than about 10 N/m$^2$. In some embodiments, substrate 700 has a Shore A hardness value less than about 100; a Shore D hardness less than about 100; and/or a Rockwell hardness less than about 150.

Substrate 700 may include or consist essentially of a semi-crystalline or amorphous material, e.g., polyethylene naphthalate (PEN), polyethylene terephthalate (PET), polycarbonate, polyethersulfone, polyester, polyimide, polyethylene, cellulose, fiber and/or paper. Substrate 700 may include or consist essentially of multiple layers, e.g., a deformable layer over a rigid layer, for example, a semicrystalline or amorphous material, e.g., PEN, PET, polycarbonate, polyethersulfone, polyester, polyimide, polyethylene, cellulose, fiber and/or paper formed over a rigid substrate, e.g., a substrate including or consisting essentially of, acrylic, aluminum, steel, or the like. In some embodiments, substrate 700 is rigid or substantially rigid and may include or consist essentially of fiberglass, FR4, glass, or a metal core printed circuit board. Depending upon the desired application for which embodiments of the invention are utilized, substrate 700 may be substantially optically transparent, translucent, or opaque. For example, substrate 700 may exhibit a transmittance or a reflectivity greater than 80% for optical wavelengths ranging between approximately 400 nm and approximately 800 nm. In some embodiments substrate 700 may exhibit a transmittance or a reflectivity of greater than 80% for one or more wavelengths emitted by semiconductor die 600. Substrate 700 may also be substantially insulating, and may have an electrical resistivity greater than approximately 100 ohm-cm, greater than approximately $1 \times 10^6$ ohm-cm, or even greater than approximately $1 \times 10^{10}$ ohm-cm.

As shown in FIG. 7, at least two conductive traces 710 are disposed on the substrate 700 to provide electrical connectivity to a device or die connected to the traces. The traces 710 are spaced apart, defining a gap 720 therebetween that may be sized based on the size of the device or die and contact spacings on the device or die to be connected to the traces. For example, the gap 720 may range between approximately 10 µm and approximately 1000 µm. The traces 710 preferably include or consist essentially of one or more conductive materials, e.g., a metal or metal alloy, carbon, etc. Traces 710 may be formed via conventional deposition for example evaporation, sputtering, chemical vapor deposition, physical vapor deposition and the like, photolithography, and etching processes, plating processes, or may be formed using a variety of printing processes. For example, traces 710 may be formed via screen printing, flexographic printing, ink jet printing, and/or gravure printing. The traces 710 may include or consist essentially of a conductive ink, which may include one or more elements such as silver, gold, aluminum, chromium, copper, and/or carbon. The traces 710 may include or consist essentially of a metal, which may include one or more elements such as silver, gold, aluminum, chromium, copper, and/or carbon. As mentioned above, various embodiments of the invention do not utilize stud bumps or similar conductive projections over traces 710; therefore, the distance between substrate 700 and a device bonded to substrate 700 may be at least in part defined by the thickness of traces 710 (which are typically equal to each other). In some embodiments, the thickness of traces 710 is preferably less than approximately 10 µm, and even more preferably less than approximately 5 µm; however, this is not a limitation of the present invention, and in other embodiments traces 710 may have any thickness. While the thickness of one or more of the traces 710 may vary, the thickness is generally substantially uniform along the length of the trace to simplify processing. However, this is not a limitation of the present invention, and in other embodiments the trace thickness or trace material may vary on substrate 700.

Referring to FIG. 8A, in various embodiments semiconductor die 600 is bonded (i.e., attached) to substrate 700. In order to enable electrical connectivity to semiconductor die 600, contacts 670, 680 are typically adhered to and in electrical contact with traces 710. With a yielding substrate 700, strong reliable bonds between the traces and the contacts are achieved by flexing (i.e., bending or deforming) at least in a region 800 between the traces 710. Substrate 700 may flex such that the distances between each of contacts 670, 680 and its corresponding trace 710 (to which it is adhered) are approximately equal. In preferred embodiments, the contacts 670, 680 are adhered to traces 710 via ACA 210. For example, ACA 210 may include or consist essentially of a pressure-activated ACA, and thus contacts 670, 680 may be electrically connected to traces 710 via conductive structures such as particles within the ACA, while the contacts 670, 680 are electrically insulated from each other (as are the traces 710), as described previously.

In another embodiment, shown in FIG. 8B, electrical conductivity is enabled by deformation of a substrate 701. In this embodiment, a portion of semiconductor die 600 or contacts 670, 680 deforms a portion of substrate 701 in region 801 and by such deformation electrical conductivity between traces 710 and contacts 670, 680 is enabled. In FIG. 8B, substrate 701 is shown as deforming only in the surface region, with no deformation of the face of substrate 701 opposite the face over which conductive traces 710 are formed. This is not necessary to the present invention, however, and in other embodiments, deformation may occur on both faces of substrate 701. Indeed, the substrate may both flex and deform, combining the behavior illustrated in FIGS. 8A and 8B.

If substrate 700 is too soft, pressure applied across semiconductor die 600 and substrate 700 may result in deformation of substrate 700 without sufficient force being applied to the ACA to establish electrical connection between traces 710 and contacts 670, 680. If substrate 700 is too hard, on the other hand, pressure applied across semiconductor die 600 and substrate 700 may result in fracture or breaking of semiconductor die 600 before the ACA is able establish electrical connection between traces 710 and contacts 670, 680. Thus, the required level of deformability for substrate 700 may also depend on the mechanical properties of semiconductor die 600; tougher semiconductor dies 600 may permit use of relatively less deformable substrate 700. Conversely, more fragile semiconductor dies 600 may require use of a relatively more deformable substrate 700. Those of skill in the art may straightforwardly determine, without undue experimentation, the appropriate degree of substrate hardness for a particular semiconductor die. In some applications, the toughness of a semiconductor die may be varied by changing its thickness or the materials from which it is fabricated.

As discussed above, ACA 210 is formed over die 600 before attachment or bonding to substrate 700 or 701. Contacts 670, 680 are then brought into physical proximity (or contact) with and adhered to traces 710 via application of pressure to semiconductor die 600, the substrate, or both. Because ACA 210 is an ACA, perfect alignment between contacts 670, 680 and traces 710 is not necessary, thus simplifying the process. Perfect alignment is not required because conduction occurs only in the vertical direction between contacts 670, 680 and traces 710, and not laterally between contacts 670, 680 or between traces 710. In one embodiment, semiconductor die 600 and substrate 700 are compressed between a substantially rigid surface and a substantially compliant surface, thereby enabling the flexure or deformation or both of substrate 700 depicted in FIGS. 8A and 8B and the resulting electrically conductive and reliable bond to semiconductor die 600 notwithstanding the nonplanarity of surface 660 and/or the non-coplanarity between contacts 670, 680.

After or during the compression of semiconductor die 600 and substrate 700 (or substrate 701) ACA 210 is cured by, e.g., application of energy, for example heat and/or ultraviolet light. For example, ACA 210 may be cured by heating to a temperature ranging from approximately 80° C. to approximately 150° C., e.g., approximately 125° C., for a period of time ranging from approximately several seconds to 1 minute to approximately 30 minutes, e.g., approximately 10 minutes, depending on the properties of the ACA.

Figure 9:
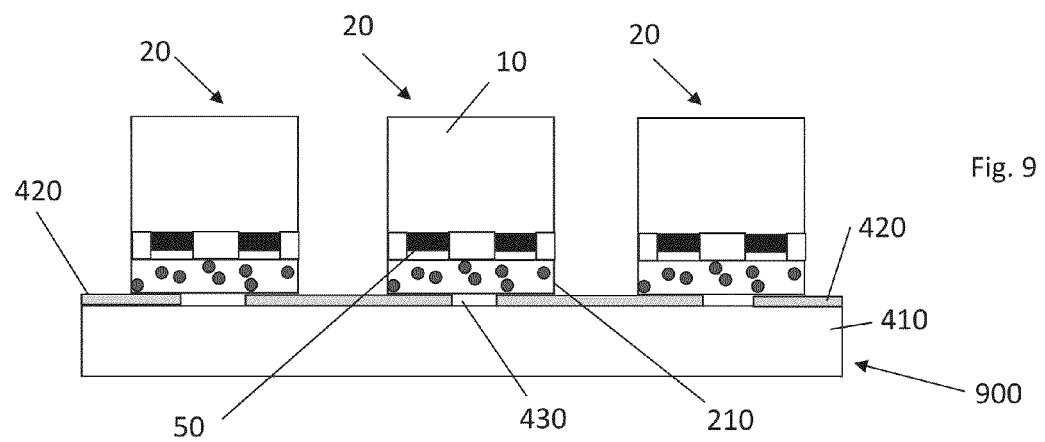
FIG. 9 is a schematic cross-section of multiple semiconductor dies adhered to a yielding substrate in accordance with various embodiments of the invention.

In some embodiments, more than one individual die 20 is bonded simultaneously. In this case individual dies may be placed over conductive traces 420 on substrate 410, either one at a time, or placed in groups. FIG. 9 shows a structure 900 similar to structure 400 shown in FIG. 4, but with three individual dies 20. FIG. 9 shows three individual dies 20, but this is not a limitation of the present invention and in other embodiments the number is smaller or larger. In some embodiments, at least 200 individual dies 20 are bonded simultaneously. In some embodiments, at least 500 individual dies 20 are bonded simultaneously. In some embodiments, at least 1000 individual dies 20 are bonded simultaneously. After placement as shown in FIG. 9, activation or curing of ACA 210 may be performed simultaneously by applying the activation source simultaneously or substantially simultaneously to all individual dies 20 on substrate 410. For example, activation or curing may be done using heat, pressure, radiation, magnetic field or a combination of two or more of these activation methods. In one embodiment, ACA 210 is activated using a combination of heat and pressure. In some embodiments, pressure is applied by compressing the substrate and individual die between two substantially rigid surfaces. In some embodiments, pressure is applied by compressing the substrate and individual die between a substantially rigid surface and a substantially compliant surface. After activation or curing, the structure looks similar to that shown in FIG. 5, but with multiple individual dies 20 that were activated simultaneously.

Figure 10:
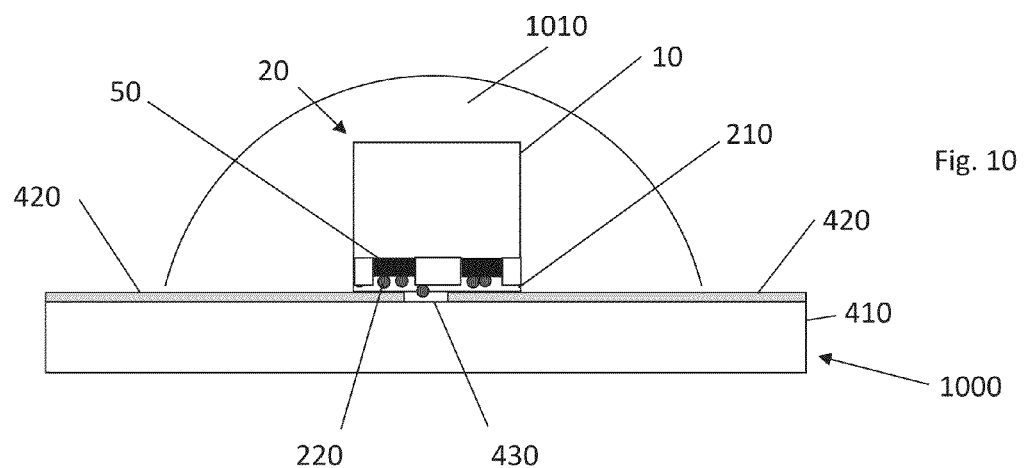
FIG. 10 is a schematic cross-section of the integration of a wavelength-conversion material with a semiconductor die adhered to a substrate in accordance with various embodiments of the invention.

Referring to FIG. 10, a wavelength-conversion material 1010 may be formed over individual dies 20 after bonding, thereby forming a structure 1000. Application or formation of the wavelength-conversion material 1010 over dies 20 may be done using a variety of processes, for example dispensing, screen printing, stencil printing, casting, molding, compression molding or the like. In some embodiments, the wavelength-conversion material 1010 is cured or partially cured after formation over dies 20. Curing may be performed in a variety of techniques, for example using heat, light, e.g., UV radiation, electron beam radiation or exposure to various chemical or vapor curing agents.

In some embodiments, wavelength-conversion material 1010 covers the top and the entirety of the sidewalls of the die 20. In some embodiments, wavelength-conversion material 1010 covers the top and only a portion of the sidewalls of die 20. FIG. 10 shows wavelength-conversion material 1010 having a hemispherical or substantially hemispherical shape. However, this is not a limitation of the present invention, and in other embodiments light conversion material has any other shape, for example a cubic or rectangular solid, or any arbitrary shape. In some embodiments, wavelength-conversion material 1010 covers die 20 in a conformal or substantially conformal manner. In some embodiments, wavelength-conversion material 1010 has a thickness that is substantially the same over the top and sidewalls of the die; however, this is not a limitation of the present invention, and in other embodiments the thickness of wavelength-conversion material 1010 has different thicknesses over different portions of the top and sides of die 20.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of fabricating an electronic device, the method comprising:

providing a wafer comprising a plurality of semiconductor layers;

forming a plurality of electrical contacts on a surface of the wafer, each electrical contact being in direct contact with at least one of the semiconductor layers thereunder, thereby defining a plurality of unsingulated chips each comprising a plurality of the electrical contacts;

thereafter, and without formation of a metallic or conductive layer on the electrical contacts therebetween, applying an anisotropic conductive adhesive (ACA) onto the surface of the wafer and in direct contact with each of the electrical contacts, thereby forming a composite wafer comprising (a) a semiconductor substrate (a) comprising one or more semiconductor materials and (b) processed into a plurality of at least partially unsingulated chips, each chip comprising (i) a plurality of exposed electrical contacts, (ii) a non-contact region disposed between the electrical contacts, a top surface of each of the electrical contacts being substantially coplanar with or recessed below a surface of the non-contact region disposed around the electrical contact, and (iii) a portion of the semiconductor substrate, wherein the semiconductor substrate comprises a back surface opposite the plurality of electrical contacts, and (b) an ACA on the semiconductor substrate, the ACA being in direct contact with the electrical contacts and the non-contact region of each chip, wherein (i) each at least partially unsingulated chip is disposed between at least a portion of the ACA and the back surface of the substrate, (ii) none of the electrical contacts comprises a solder bump or a non-solder bump, and (iii) no solder bumps or non-solder bumps are disposed between the electrical contacts and the ACA;

thereafter, singulating the composite wafer into individual chips, each chip comprising first and second electrical contacts with the ACA thereover;

providing a substrate having first and second conductive traces on a first surface thereof in a bonding region, the first and second conductive traces being separated by a gap therebetween;

positioning first and second electrical contacts of one of the chips over the first and second conductive traces, a portion of the ACA being disposed between the electrical contacts and the traces; and bonding the first and second electrical contacts of the chip to the first and second traces, respectively, thereby establishing electrical connection between at least one of (i) the first electrical contact and the first trace or (ii) the second electrical contact and the second trace, but without electrically bridging the traces together or electrically bridging the electrical contacts together.

2. The method of claim 1, wherein the ACA comprises an anisotropic conductive film.

3. The method of claim 2, wherein applying the ACA onto the surface of the wafer comprises laminating the anisotropic conductive film to the wafer.

4. The method of claim 1, wherein, for each unsingulated chip, the top surface of each of the plurality of electrical contacts is absolutely coplanar with or recessed below the surface of the chip surrounding the electrical contact.

5. The method of claim 1, wherein, for each unsingulated chip, the top surface of each of the plurality of electrical contacts is recessed below the surface of the chip surrounding the electrical contact by more than 3 µm.

6. The method of claim 1, wherein forming the plurality of electrical contacts over the surface of the wafer comprises only a single deposition step.

7. A composite wafer comprising:
a semiconductor substrate (a) comprising one or more semiconductor materials and (b) processed into a plurality of at least partially unsingulated chips, each chip comprising (i) a plurality of exposed electrical contacts, (ii) a non-contact region disposed between the electrical contacts, a top surface of each of the electrical contacts being substantially coplanar with or recessed below a surface of the non-contact region disposed around the electrical contact, and (iii) a portion of the semiconductor substrate, wherein the semiconductor substrate comprises a back surface opposite the plurality of electrical contacts; and
an anisotropic conductive adhesive (ACA) on the semiconductor substrate, the ACA being in direct contact with the electrical contacts and the non-contact region of each chip,
wherein (i) each at least partially unsingulated chip is disposed between at least a portion of the ACA and the back surface of the substrate, (ii) none of the electrical contacts comprises a solder bump or a non-solder bump, and (iii) no solder bumps or non-solder bumps are disposed between the electrical contacts and the ACA.

8. The wafer of claim 7, further comprising a plurality of trenches extending through only a portion of a thickness of the substrate and partially singulating the chips.

9. The wafer of claim 8, wherein a portion of the ACA is disposed over each of the trenches.

10. The wafer of claim 8, wherein the ACA comprises discrete portions separated approximately along the trenches.

11. The wafer of claim 7, wherein the ACA comprises an anisotropic conductive film.

12. The wafer of claim 7, wherein each chip comprises a light-emitting diode (LED) die.

13. The wafer of claim 12, wherein each LED die comprises an inorganic LED die.

14. The wafer of claim 13, wherein at least a portion of each LED die comprises a semiconductor material comprising at least one of silicon, GaAs, InAs, AlAs, InP, GaP, AlP, InSb, GaSb, AlSb, GaN, InN, AlN, SiC, ZnO, or an alloy or mixture thereof.

15. The wafer of claim 7, wherein each chip comprises a laser.

16. The wafer of claim 7, wherein a thickness of the ACA across the semiconductor substrate is substantially uniform.

17. The wafer of claim 7, wherein, for each at least partially unsingulated chip, the top surface of each of the plurality of electrical contacts is absolutely coplanar with or recessed below the surface of the chip surrounding the electrical contact.

18. The wafer of claim 7, wherein, for each at least partially unsingulated chip, the top surface of each of the plurality of electrical contacts is recessed below the surface of the chip surrounding the electrical contact by more than 3 µm.

19. The wafer of claim 7, wherein, for each at least partially unsingulated chip, each of the plurality of electrical contacts is in direct physical contact with (i) a semiconductor portion of the chip thereunder and (ii) the ACA.

20. The wafer of claim 7, wherein, for each chip, the top surface of at least one of the plurality of electrical contacts extends above, by 3 µm or less, the surface of the non-contact region disposed therearound.

21. The wafer of claim 7, wherein, for each chip, each of the plurality of electrical contacts comprises a metal silicide or metal nitride compound.

22. The wafer of claim 7, wherein, for each chip, each of the plurality of electrical contacts comprises a metal layer and a second layer comprising a metal silicide or metal nitride compound.

23. The wafer of claim 7, wherein, for each chip, each of the plurality of electrical contacts comprises at least one of Al, Cr, Ti, Au, Ni, Ag, or Mo.

24. The wafer of claim 7, wherein two of the electrical contacts of at least one of the chips are non-coplanar with respect to each other.

25. The wafer of claim 7, wherein the ACA is at least partially transparent.

26. The wafer of claim 7, further comprising a protective layer disposed over at least a portion of the ACA.

27. The wafer of claim 7, further comprising a wavelength-conversion material disposed over the chips.

* * * * *